United States Patent
Ukitsu et al.

(10) Patent No.: US 11,493,394 B2
(45) Date of Patent: Nov. 8, 2022

(54) CAPACITANCE DETECTION DEVICE

(71) Applicant: Panasonic Intellectual Property Management Co., Ltd., Osaka (JP)

(72) Inventors: Hironobu Ukitsu, Osaka (JP); Yuta Moriura, Osaka (JP); Hiroyuki Furuya, Osaka (JP); Takashi Matsumoto, Osaka (JP); Yui Sawada, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 54 days.

(21) Appl. No.: 17/043,622

(22) PCT Filed: Jan. 17, 2019

(86) PCT No.: PCT/JP2019/001229
§ 371 (c)(1),
(2) Date: Sep. 29, 2020

(87) PCT Pub. No.: WO2019/187516
PCT Pub. Date: Oct. 3, 2019

(65) Prior Publication Data
US 2021/0018379 A1    Jan. 21, 2021

(30) Foreign Application Priority Data

Mar. 30, 2018   (JP) .............................. JP2018-069342

(51) Int. Cl.
*G01L 5/22*     (2006.01)
*G01D 5/24*     (2006.01)
(Continued)

(52) U.S. Cl.
CPC ................ *G01L 5/228* (2013.01); *G01D 5/24* (2013.01); *G01L 1/144* (2013.01); *G01R 27/2605* (2013.01)

(58) Field of Classification Search
CPC ........... G01L 1/144; G01L 5/228; G01L 1/14; G01D 5/24; G01R 27/2605
(Continued)

(56) References Cited

U.S. PATENT DOCUMENTS 4,644,801 A * 2/1987 Kustanovich ........... G01L 1/146
73/862.626
2006/0033507 A1  2/2006 Gaumel et al.
2014/0049273 A1  2/2014 Rocznik

FOREIGN PATENT DOCUMENTS

JP   2000-258272 A   9/2000
JP   2006-518033 A   8/2006
(Continued)

OTHER PUBLICATIONS

International Preliminary Report on Patentability issued in corresponding International Patent Applicaton No. PCT/JP2019/001229, dated Oct. 6, 2020, with English translation.
(Continued)

*Primary Examiner* — Farhana A Hoque
(74) *Attorney, Agent, or Firm* — McDermott Will & Emery LLP

(57) ABSTRACT

A capacitance detection device includes: a sensor unit including a plurality of sensor elements; row control lines; column control lines; a control circuit supplying a charging voltage to the sensor element; and an equipotential circuit outputting a potential equal to the potential of the sensor element subject to measurement. The control circuit applies a charging voltage to the row control line connected to the sensor element and connects the column control line connected to the sensor element to the ground potential side.

(Continued)

The control circuit causes the equipotential circuit to set a potential of at least one of the row control lines other than the row control line connected to the sensor element subject to measurement and the column control lines other than the column control line connected to the sensor element subject to measurement to a potential equal to the potential of the sensor element subject to measurement.

5 Claims, 13 Drawing Sheets

(51) Int. Cl.
  *G01L 1/14* (2006.01)
  *G01R 27/26* (2006.01)
(58) Field of Classification Search
  USPC .......................................................... 324/686
  See application file for complete search history.

(56) References Cited

FOREIGN PATENT DOCUMENTS

| JP | WO2011/125725 | A1 | 10/2011 |
| JP | 5326042 | B2 | 10/2013 |
| WO | 2011/125725 | A1 | 10/2011 |

OTHER PUBLICATIONS

Chinese Office Action with Search Report issued in corresponding Chinese Patent Application No. 201980014432.9, dated Sep. 3, 2021, with English translation.
English translation of Search Report issued in corresponding Chinese Patent Application No. 201980014432.9, dated Sep. 3, 2021.
International Search Report issued in corresponding International Patent Application No. PCT/JP2019/001229, dated Apr. 2, 2019, with English abstract.
Notice of Reasons for Refusal dated Mar. 29, 2022 issued in the corresponding Japanese Patent Application No. 2020-509701, with English machine translation.

* cited by examiner

CAPACITANCE DETECTION DEVICE

CROSS-REFERENCE OF RELATED APPLICATIONS

This application is the U.S. National Phase under 35 U.S.C. § 371 of International Patent Application No. PCT/JP2019/001229, filed on Jan. 17, 2019, which in turn claims the benefit of Japanese Application No. 2018-069342, filed on Mar. 30, 2018, the entire disclosures of which Applications are incorporated by reference herein.

TECHNICAL FIELD

The present disclosure relates to a capacitance detection device detecting a capacitance of a sensor element.

BACKGROUND ART

Patent Document 1 discloses a capacitive sensor device capable of measuring a capacitance of a capacitive sensor. This capacitive sensor device includes: a capacitive sensor including first and second electrodes disposed to face each other at a distance and having a capacitance between the first and second electrodes which changes due to application of an external force, or approach or contact of an operator; a voltage applying means connected in series to the first electrode of the capacitive sensor and applying a periodic rectangular wave voltage to the capacitive sensor; a rectifier connected to the second electrode of the capacitive sensor and rectifying electric charges that are charged to and discharged from the capacitive sensor when the voltage applying means applies a periodic rectangular wave voltage; a smoothing capacitor connected in parallel to the rectifier; a shunt resistor for current measurement connected in parallel to the smoothing capacitor; and a voltage measuring means measuring a voltage across the shunt resistor for current measurement.

PATENT DOCUMENT

Patent Document 1: Japanese Patent gazette No. 5326042

SUMMARY

Technical Problem

In the capacitive sensor device, the capacitive sensors are two-dimensionally arranged. Such a configuration has a problem that when a voltage of a capacitive sensor subject to measurement is measured, a capacitance of another sensor connected to a control line which is also connected to the sensor subject to measurement is also measured, resulting in a measurement error.

Solution to Problem

To solve the problem described above, an object of the present disclosure is to provide a capacitance detection device capable of accurately measuring the capacitance.

A capacitance detection device according to an aspect of the present disclosure includes: a sensor unit including a plurality of sensor elements which are arranged two-dimensionally and whose capacitances change; a plurality of row control lines connecting the sensor elements in the row direction and applying to the sensor elements a predetermined charging voltage for detecting the capacitance of the sensor elements; a plurality of column control lines connecting the sensor elements in a column direction and connecting the sensor elements to the ground potential side; a control circuit supplying a charging voltage to the sensor element subject to measurement via the row control lines, measuring a voltage change of the sensor element, and detecting the capacitance of the sensor element based on the voltage change; and an equipotential circuit outputting a signal having a potential equal to the potential of the sensor element subject to measurement. The control circuit applies a charging voltage to the row control line connected to the sensor element subject to measurement, connects the column control line connected to the sensor element to the ground potential side. The control circuit causes the equipotential circuit to set a potential of at least one of the row control line other than the row control line connected to the sensor element subject to measurement and the column control lines other than the column control line connected to the sensor element subject to measurement to a potential equal to the potential of the sensor element subject to measurement.

Advantageous Effects of Invention

According to the present disclosure, an influence of the capacitance on the sensor element other than that subject to measurement can be reduced, and therefore, the capacitance measurement accuracy can be improved.

DESCRIPTION OF EMBODIMENTS

Embodiments of the capacitance detection device of the present disclosure will hereinafter be described in detail with reference to the drawings as appropriate.

First Embodiment

1. Configurations

Figure 1:
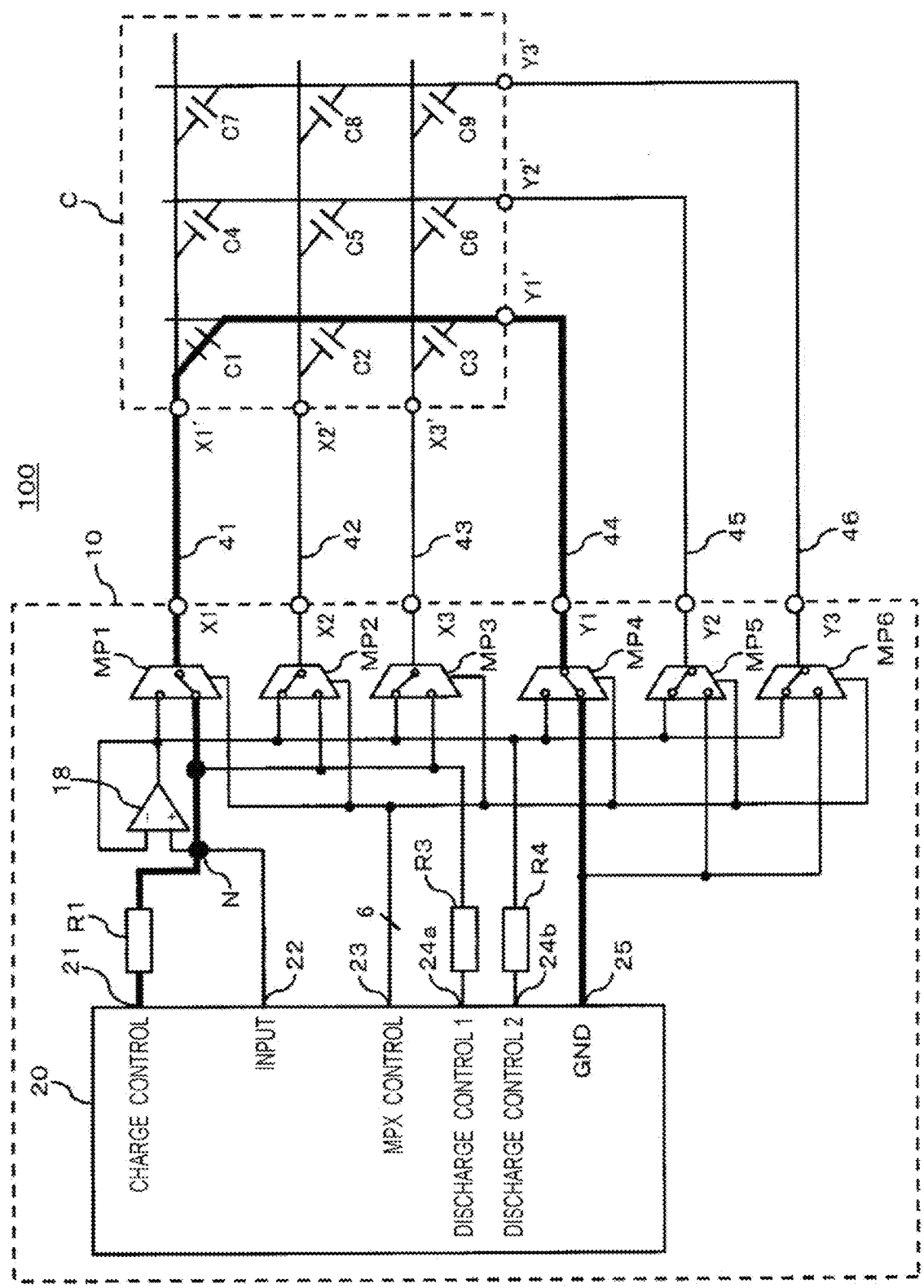
FIG. 1 is a diagram showing a configuration of a capacitance detection device according to a first embodiment of the present disclosure.

FIG. 1 is a diagram showing a configuration of a capacitance detection device of the present disclosure. A capacitance detection device 100 includes a sensor unit C including multiple sensor elements C1 to C9 whose capacitances may change, and a measurement unit 10 measuring the capacitances of the sensor elements C1 to C9 of the sensor unit C.

The measurement unit 10 and the sensor unit C are connected by row control lines 41 to 43 and column control lines 44 to 46. The row control lines 41 to 43 connect the terminals X1 to X3 of the measurement unit 10 and the terminals X1' to X3' of the sensor unit C, respectively. The column control lines 44 to 46 connect the terminals Y1 to Y3 of the measurement unit 10 and the terminals Y1' to Y3' of the sensor unit C, respectively.

The sensor unit C includes nine capacitive sensor elements C1 to C9 whose capacitances may change. The sensor elements C1 to C9 are two-dimensionally arranged in 3 rows×3 columns. Each sensor element is connected to one row control line 41 to 43 and one column control line 44 to 46.

The sensor elements C1 to C9 are capacitance type tactile sensors. When the sensor elements C1 to C9 are touched or pushed, the capacitance values thereof change depending on a touched strength or a pressed strength. The sensor element may not necessarily be a tactile sensor, and any sensor such as a pressure sensor can be used as long as the sensor is a capacitive sensor. Although the configuration of the sensor elements arranged in 3 rows×3 columns has been described in FIG. 1 for convenience of description, the number of sensor elements in the sensor unit C is not limited thereto, and the sensor elements may be arranged in M rows×N columns (M and N are any natural numbers).

The measurement unit 10 includes a microcontroller 20 measuring a capacitance of each of the sensor elements C1 to C9 in the sensor unit C, multiplexers MP1 to MP6, an equipotential circuit 18, and a resistor R1.

The microcontroller 20 is a control circuit implementing a predetermined function in cooperation with software (program). The microcontroller 20 includes a charge control terminal 21, an input terminal 22, a multiplexer (MPX) control terminal 23, discharge control terminals 24a, 24b, and a ground (GND) terminal 25.

The charge control terminal 21 is a terminal outputting a charging voltage (Vin) for measuring the potentials of the sensor elements C1 to C9. The potential of the charge control terminal 21 is controlled to "H" (High) or "L" (Low).

The input terminal 22 is a terminal for inputting the voltage (sensing voltage) of the sensor elements C1 to C9 subject to measurement. The microcontroller 20 includes an AD converter and therefore can convert the analog value of the sensing voltage input via the input terminal 22 into a digital value by the AD converter.

The discharge control terminals 24a, 24b are terminals for discharging the charges accumulated in the sensor elements C1 to C9. The discharge control terminals 24a, 24b are controlled at a high impedance during the measurement of the capacitance and are controlled to "L" when the sensor elements C1 to C3 are discharged.

The MPX control terminal 23 outputs a control signal for switching the respective inputs of the multiplexers MP1 to MP6. A signal controlling switching of an input of a multiplexer MPx is referred to as an MPX control x signal.

The ground terminal 25 is a terminal for connecting to a ground potential.

The equipotential circuit 18 comprises an OP amplifier having output fed back to a negative input terminal (−) and outputs a signal having a potential equal to that of a signal input to a positive input terminal (+). Since the OP amplifier of the equipotential circuit 18 is supplied with power from the outside, the equipotential circuit 18 outputs the signal having a potential equal to that of the signal input to the positive input terminal (+) without drawing a current from the positive input terminal (+). The positive input terminal (+) of the equipotential circuit 18 is connected to the node N. The node N is a node at which the potentials of the sensor elements C1 to C9 subject to measurement are detected. The output of the equipotential circuit 18 is connected to the inputs of the multiplexers MP1 to MP6. As a result, the equipotential circuit 18 can control the potentials of the row control lines 41 to 43 and the column control lines 44 to 46 to be equal to the potential of the sensor elements C1 to C9 subject to measurement.

A node N between the sensor elements C1 to C9 and the resistor R1 is connected to the charge control terminal 21 via the resistor R1, to the input terminal 22, and the discharge control terminal 23 via the resistor R3. At this node N, the voltage (sensing voltage) of the sensor elements C1 to C9 is measured. Therefore, the sensing voltage Vc is the voltage of the sensor element in the RC circuit which comprises the resistor R1 and any of the sensor elements C1 to C9.

The multiplexers MP1 to MP6 are two-input, one-output multiplexers. The charge control terminal 21 is connected to one input of each of the multiplexers MP1 to MP3 via the resistor R, and the output of the equipotential circuit 18 is connected to the other input. The ground terminal 25 is connected to one input of each of the multiplexers MP4 to MP6, and the output of the equipotential circuit 18 is connected to the other input.

The outputs of the multiplexers MP1 to MP3 are connected to the row control lines 41 to 42, respectively. The outputs of the multiplexers MP4 to MP6 are connected to the column control lines 44 to 46, respectively.

The discharge control terminal 24a is connected to one input of each of the multiplexers MP1 to MP3. The discharge control terminal 24b is connected to the other inputs of the multiplexers MP4 to MP6. At the time of discharging, the electric charge accumulated in the sensor elements C1 to C3 can be discharged by setting the discharge control terminals 24a, 24b to "L".

The multiplexers MP1 to MP3, MP4 to MP5 receive a control signal from the MPX control terminal 23 and switch the inputs thereof.

2. Operations

An operation of the capacitance detection device 100 configured as above will hereinafter be described.

The capacitance detection device 100 measures the capacitance of each sensor element while sequentially switching the sensor element subject to measurement in the sensor unit C. The sensor element subject to measurement is supplied with the charging voltage via the row control lines 41 to 43, and in this case, the sensor elements other than the sensor element subject to measurement are also supplied with the charging voltage. This causes a problem that, in addition to the capacitance of the sensor element subject to measurement, the capacitances of other sensor elements are also measured.

Figure 2:
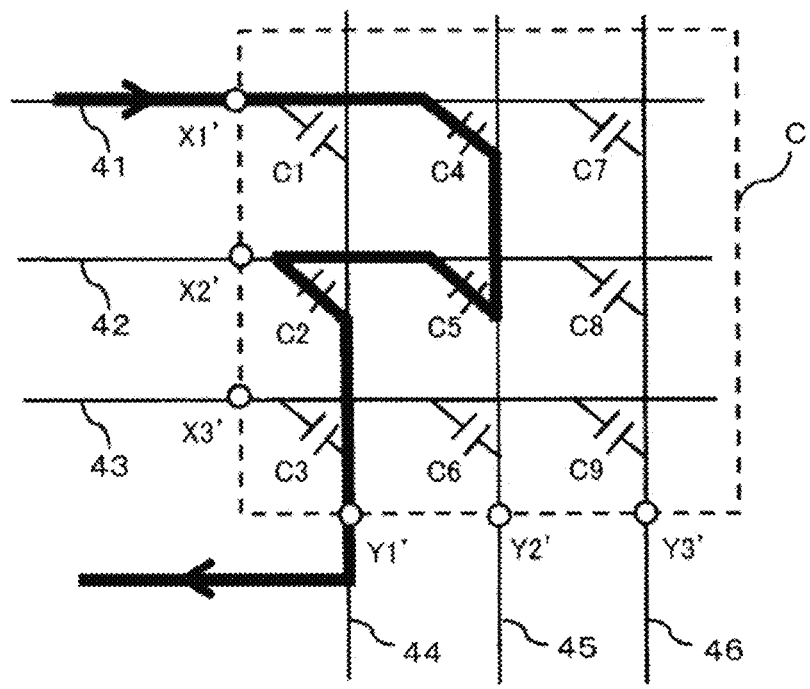
FIG. 2 is a diagram for demonstrating how sensor elements other than a sensor element subject to measurement are charged.

For example, when the sensor element C1 is subject to measurement, the row control line 41 and the column control line 44 are selected. As a result, the charging voltage for measurement is applied between a node X1' and a node Y1'. In this case, as shown in FIG. 2, a current path passing through, for example, the sensor elements C4, C5, C2 in addition to the sensor element C1 is formed, and the voltage is also supplied to the sensor elements C4, C5, C2. Therefore, in addition to the capacitance of the sensor element C1 subject to measurement, the capacitances of the sensor elements C2, C4, C5 are also measured, so that the measurement accuracy is reduced.

Therefore, in the capacitance detection device 100 according to this embodiment, the charging voltage is supplied to the sensor element subject to measurement, and the output of the equipotential circuit 18 is connected to the control lines 41 to 43, 44 to 46 other than the row control line and the column control line connected to the sensor element subject to measurement. The equipotential circuit 18 outputs the potential of the node N, i.e., the sensor element subject to measurement. Therefore, the potentials of the control lines 41 to 43, 44 to 46 other than the row control line and the column control line connected to the sensor element subject to measurement are equal to the potential of the sensor element subject to measurement. As a result, the electric charge accumulated in the capacitance of the sensor elements other than the sensor element subject to measurement is reduced.

For example, when the sensor element C1 is subject to measurement, the charge control terminal 21 is connected to the row control line 41 of the sensor element C1, and the ground terminal 25 is connected to the column control line 44. At the same time, the output of the equipotential circuit 18 is connected to the row control lines 42, 43 and the column control lines 45, 46 other than the row control line 41 and the column control line 44 connected to the sensor element C1 subject to measurement. As a result, the potentials of the row control lines 42, 43 and the column control lines 45, 46 become equal to the potential of the sensor element C1 subject to measurement. Therefore, electric charges can be prevented from being accumulated in the capacitances of the sensor elements C2, C4, C5. Therefore, the measurement accuracy can be improved.

Figure 3:
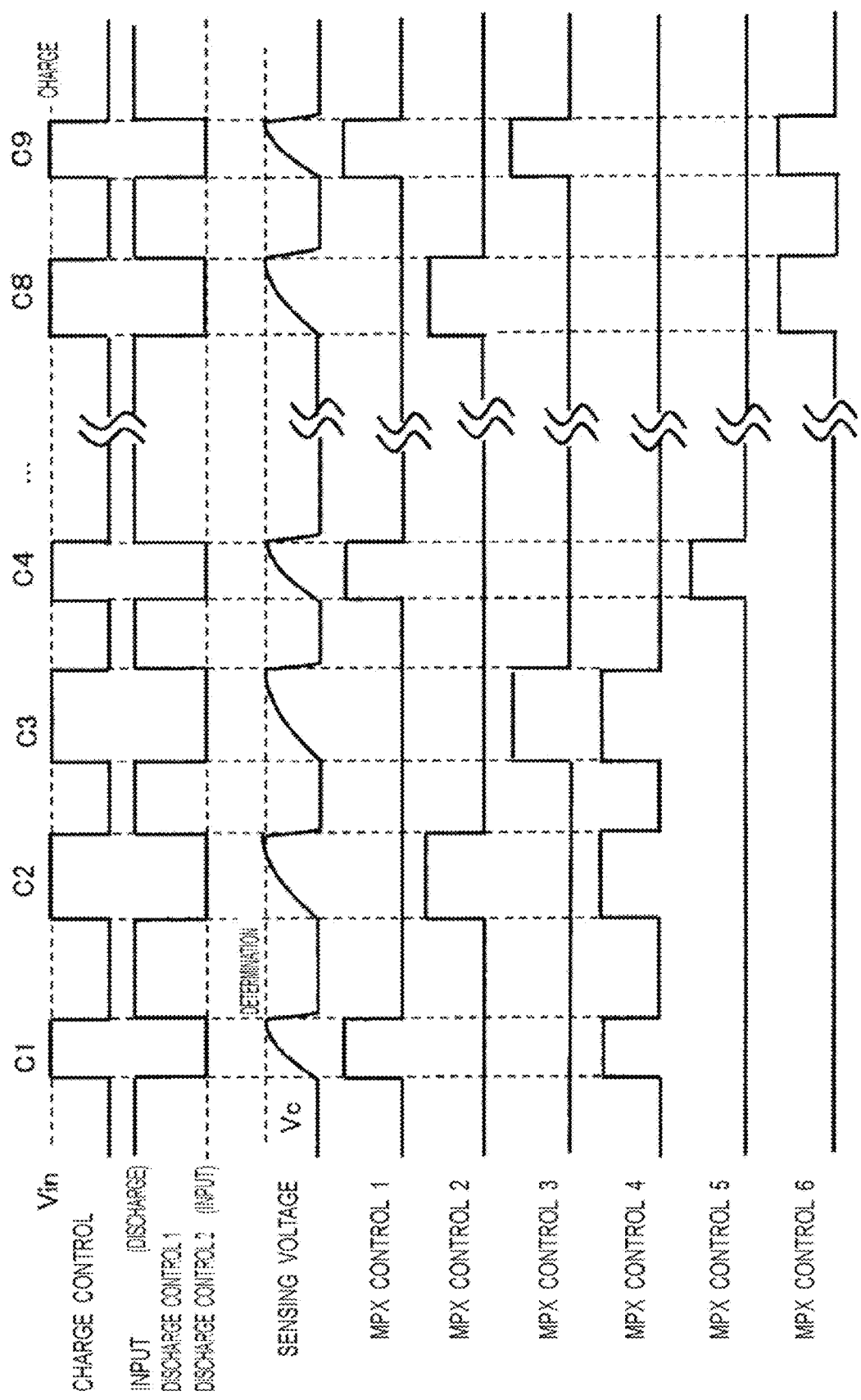
FIG. 3 is a timing chart of the capacitance detection device when a time measurement method is adopted.

FIG. 3 is a timing chart of the capacitance detection device 100 of the embodiment. The operation of the capacitance detection device 100 will hereinafter be described with reference to FIG. 3.

Firstly, the microcontroller 20 puts each of the input terminal 22 and the discharge control terminals 24a, 24b into a discharge state (each to "L"), and the electric charge accumulated in a sensor element which was previously subject to measurement is discharged. In the example of FIG. 3, the electric charges accumulated in a sensor element C9 or the like are discharged.

The microcontroller 20 puts the input terminal 22 and the discharge control terminals 24a, 24b into a voltage input state and controls the multiplexer MP1 to connect the row control line 41 to the charge control terminal 1. At the same time, the microcontroller 20 controls the multiplexer MP4 to connect the column control line 44 to the ground terminal 25. The multiplexers MP1, MP4 are controlled by an MPX control 1 signal and an MPX control 4 signal, respectively. As a result, the charging voltage Vin is supplied from the charging control terminal 1 to the sensor element C1 subject to measurement.

Simultaneously, the microcontroller 20 controls the multiplexers MP2, MP3 to connect the output of the equipotential circuit 18 to the row control lines 42, 43 and controls the multiplexers MP5, MP6 to the column control lines 45, 46. The multiplexers MP2, MP3, MP5, MP6 are controlled by an MPX control 2 signal, an MPX control 3 signal, an MPX control 5 signal, and an MPX control 6 signal, respectively. As a result, the potentials of the row control lines 42, 43 and the column control lines 45, 46 become the same as the potential of the node N, i.e., the potential of the sensor element C1 subject to measurement, and charge accumulation in the sensor elements C2 to C9 is prevented.

The sensor element C1 is charged with the charging voltage Vin from the charging control terminal 21. The microcontroller 20 obtains the sensing voltage Vc of the sensor element C1 via the input terminal 22, measures the time t from the start of charging until the sensing voltage Vc reaches a predetermined voltage value, and obtains the capacitance C of the sensor element C1 based on the time t.

A relationship between the capacitance C and the sensing voltage Vc is expressed by the following equation.

Figure 4:
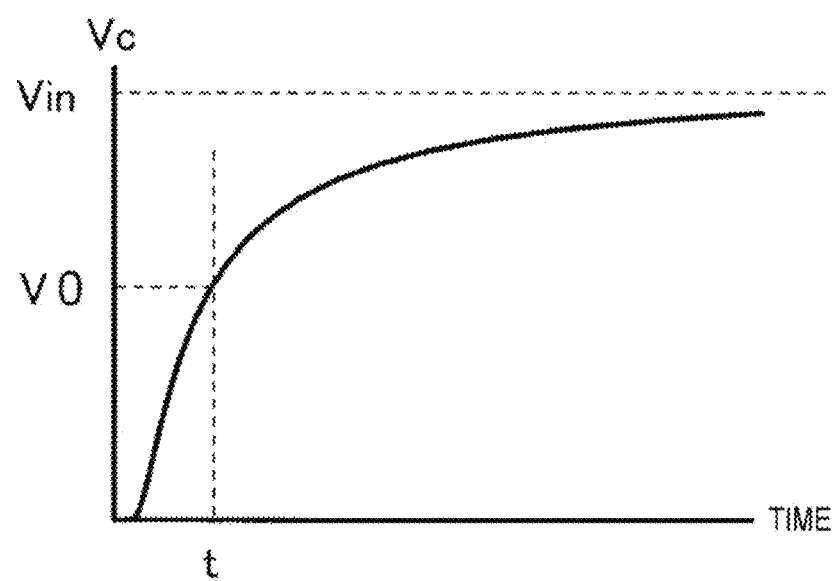
FIG. 4 is a diagram for describing the time change of the measured voltage of the sensor element

[Math. 1]

$$Vc = Vin\left\{1 - \exp\left(-\frac{t}{RC}\right)\right\} \quad (1)$$

where R denotes a resistance value of the resistor R, C denotes a capacitance of the sensor subject to measurement, t denotes a charging time, and Vin denotes a value of the charging voltage. FIG. 4 is a diagram showing a time change of the sensing voltage Vc according to Eq. (1). The microcontroller 20 measures a time t until the sensing voltage Vc reaches a predetermined voltage value V0. The microcontroller 20 obtains the capacitance C from the measured time t in accordance with Eq. (1).

When the measurement of the sensor element C1 is completed, the microcontroller 20 puts the input terminal 22 and the discharge control terminals 24a and 24b to "L" to discharge the electric charge accumulated in the sensor element C1 etc.

The microcontroller 20 puts the input terminal 22 and the discharge control terminal 23 into a voltage input state, the multiplexer MP2 switches to the next sensor element C2, and the charging with the voltage Vin from the charge control terminal 21 can be performed to measure the capacitance of the next sensor element C2. Subsequently, the sensor elements C1 to C9 subject to measurement are sequentially switched in the same way to measure the capacitance of each of the sensor elements.

In the control, the level is changed from "L" to "H" during charging as shown in the flowchart of FIG. 3; however, this in not necessarily required. The "H" and "L" levels of the charge control and the discharge control may be inverted so that the "H" is normally set and the "L" is controlled during the charge control, and the same measurement can be performed.

In the control described above, when the capacitance of the sensor elements C1 to C9 subject to measurement is obtained, the time t until the sensing voltage Vc reaches a constant voltage V0 is measured, and the capacitance of the sensor element is obtained by using the time t based on Eq. 1 in the example. A method of measuring the time t of the sensing voltage Vc reaching the constant voltage V0 and obtaining the capacitance C based on the time t is hereinafter referred to as a "time measurement method".

Figure 5:
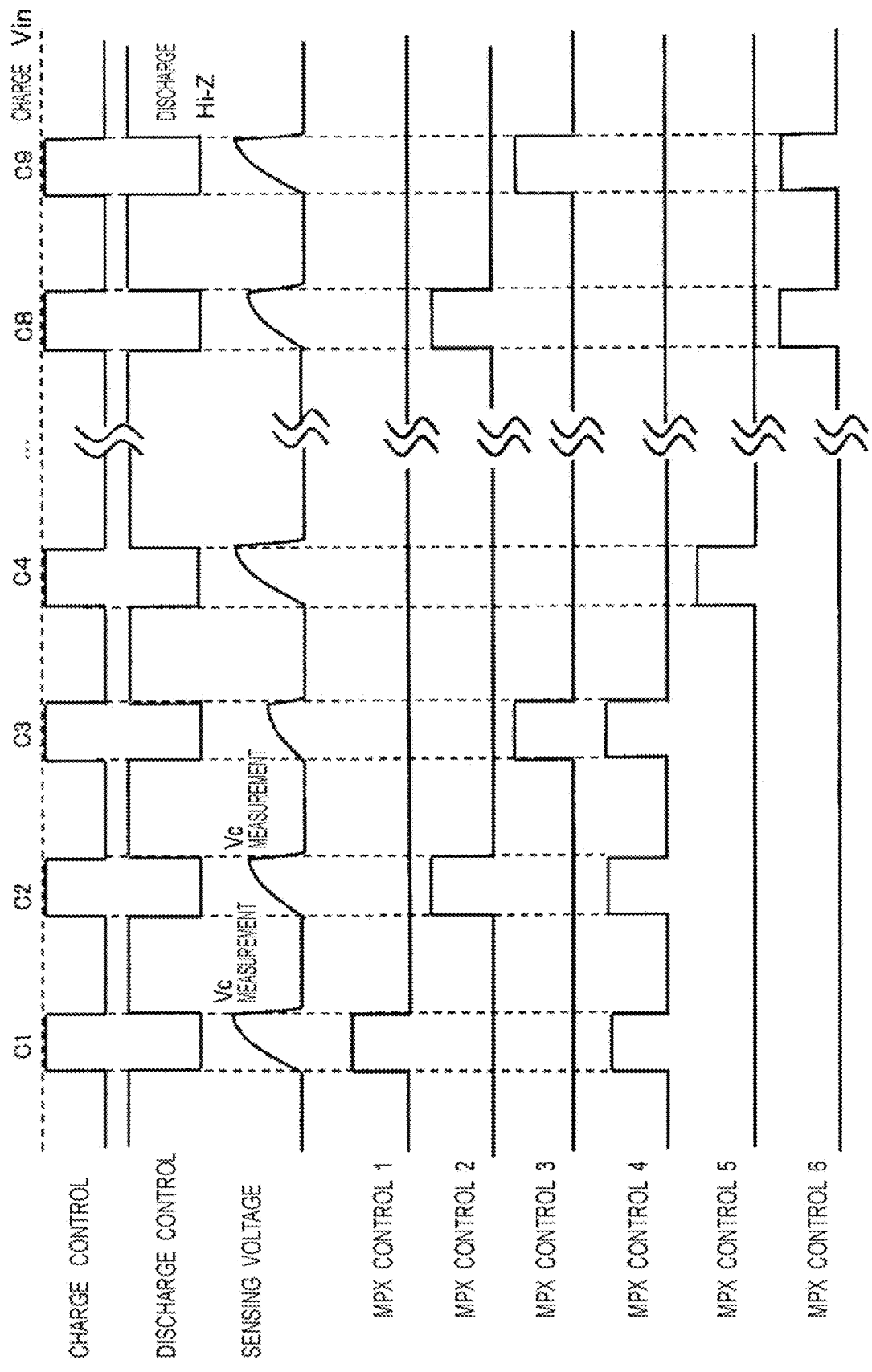
FIG. 5 is a timing chart of the capacitance detection device when a voltage measurement method is adopted.

On the other hand, by measuring the sensing voltage Vc when the sensor elements C1 to C9 are charged for a certain time t0, the capacitance C can be obtained from Eq. (1) based on the measured voltage Vc. In this case, the microcontroller 20 includes a timer therein and measures the certain time (t0) with this timer. A method of obtaining the capacitance C from Eq. (1) based on the measured voltage Vc is referred to as a "voltage measurement method". The microcontroller 20 may calculate the capacitance by this voltage measurement method instead of the time measurement method. FIG. 5 shows a timing chart when the capacitance is obtained by the voltage measurement method. In the case of the time measurement method, as shown in FIG. 3, the amplitude of the sensing voltage Vc is constant, and the width thereof varies in accordance with the capacitance of the sensor element. On the other hand, in the case of the voltage measurement method, as shown in FIG. 5, although the width of the sensing voltage Vc is substantially constant, the amplitude of the sensing voltage Vc varies in accordance with the capacitance of the sensor element.

The microcontroller 20 may use the time measurement method and the voltage measurement method together. Specifically, when the potentials of the sensor elements C1 to C9 are measured by the voltage measurement method, if the capacitance is small, the method has a problem that an error of a value of the capacitance obtained from Eq. (1) becomes large. On the other hand, the time measurement method has a problem that although a linear value can be measured at a small capacitance, the measurement takes time when the capacitance is large.

Figure 6:
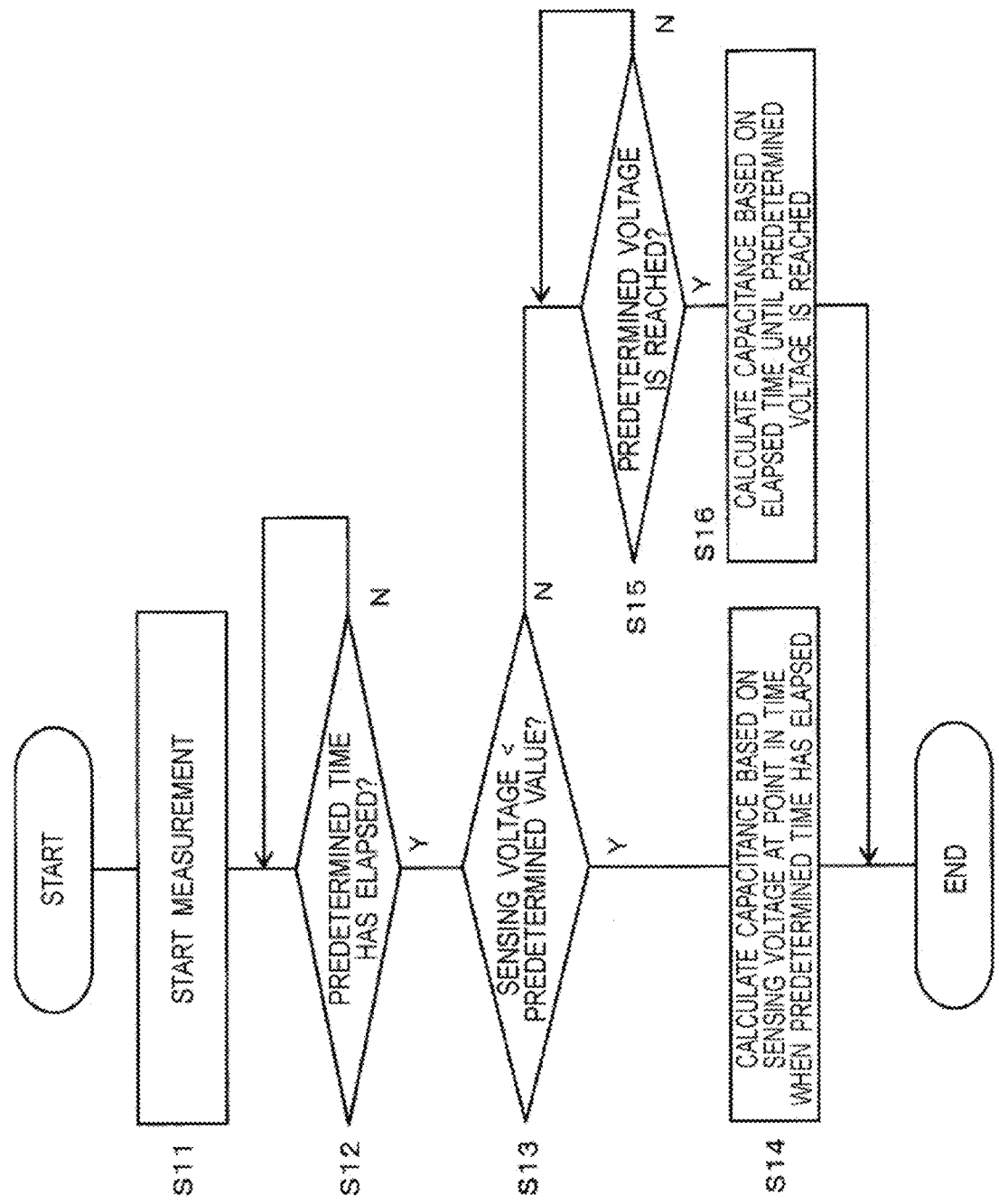
FIG. 6 is a flowchart showing a capacity measurement process in a microcontroller when the time measurement method and the voltage measurement method are used together.

Therefore, the time measurement method and the voltage measurement method may be used together. For example, when the measurement time is prioritized, firstly, the sensing voltage Vc after the elapse of a certain time is measured by the voltage measurement method, and as a result, when the sensing voltage Vc is small (i.e., when the capacitance is large), the result (measurement result of the voltage measurement method) is adopted. On the other hand, when the sensing voltage Vc is large (i.e., when the capacitance is small), the measurement result of the time measurement method is adopted. FIG. 6 shows a flowchart in this case.

In FIG. 6, the microcontroller 20 starts measuring the sensing voltage Vc of the sensor elements C1 to C9 (S11). After the elapse of a predetermined time (t0) (S12), the sensing voltage Vc is compared with a predetermined value (S13). If the sensing voltage Vc is smaller than the predetermined value (YES at S13), the capacitance is calculated based on the sensing voltage Vc measured at point in time when the predetermined time (t0) has elapsed (S14). On the other hand, if the sensing voltage Vc is equal to or greater than the predetermined value (NO at S13), the measurement is continued until the sensing voltage Vc reaches a predetermined voltage (V0) (S15). The capacitance is calculated based on the elapsed time until the sensing voltage Vc reaches the predetermined voltage (V0) (S16).

Figure 7:
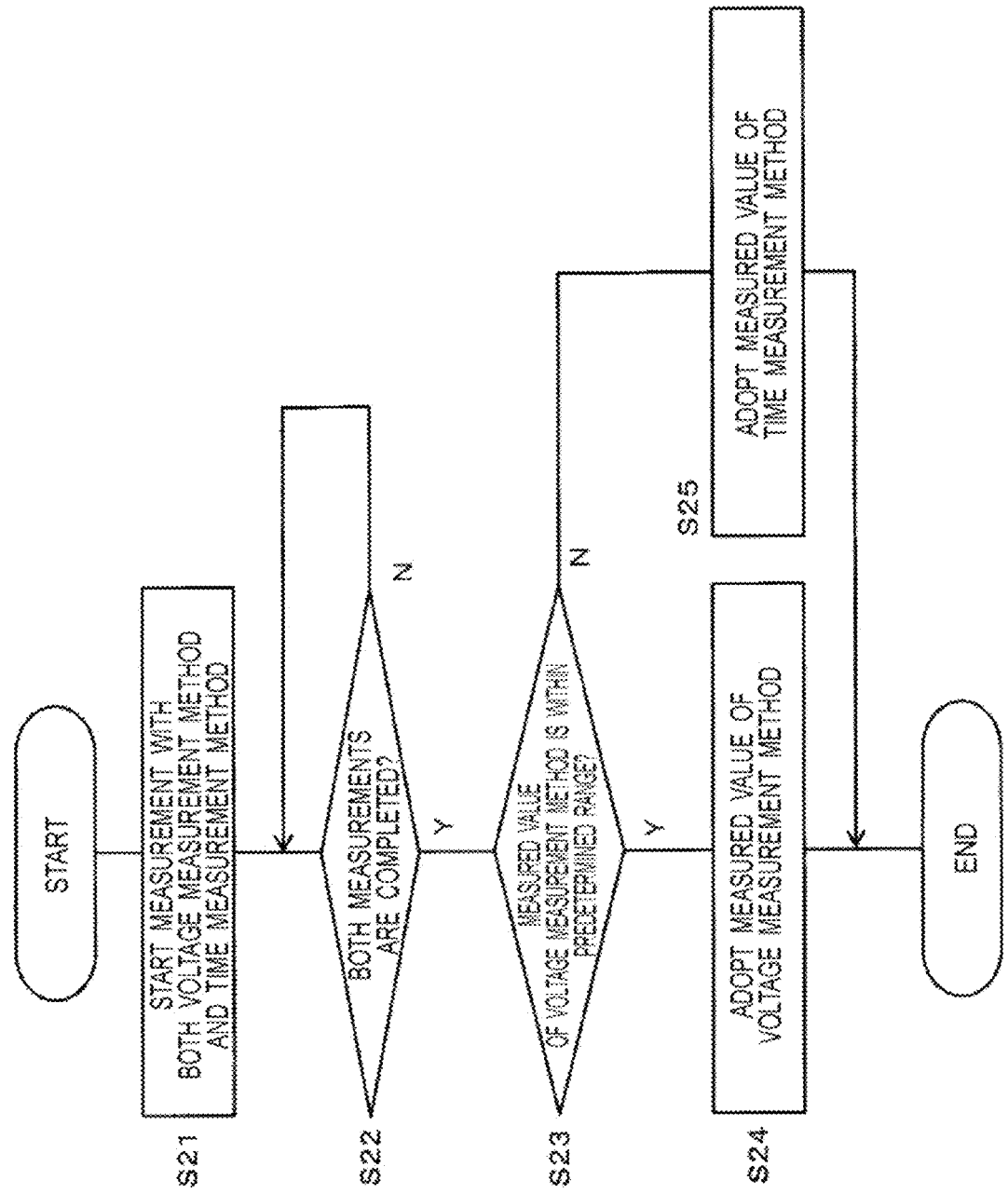
FIG. 7 is a flow chart showing another example of capacity measurement process in the microcontroller when the time measurement method and the voltage measurement method are used together.

When measurement accuracy is prioritized, for example, measurement is performed with both the time measurement method and the voltage measurement method, and if the result of the voltage measurement method is within a range of good accuracy, the result of the voltage measurement method may be adopted. FIG. 7 shows a flowchart in this case.

The microcontroller 20 measures the sensing voltage Vc with both the voltage measurement method and the time measurement method (S21). When the measurement is completed with both methods (S22), the microcontroller 20 determines whether the measured value of capacitance calculated based on the measurement result (measured voltage) of the voltage measurement method is within a predetermined range in which an accurate result is obtained (S23). If the measured value of capacitance is a value within a predetermined range in which an accurate result is obtained (YES at S23), the measured value of capacitance from the voltage measurement method is adopted. On the other hand, if the measured value of capacitance is not within the predetermined range in which an accurate result is obtained (NO at S23), the measured value of capacitance from the time measurement method is adopted (S25).

3. Effects, Etc

As described above, the capacitance detection device 100 according to this embodiment includes the sensor unit C including the plurality of sensor elements C1 to C9 which are arranged two-dimensionally and whose capacitances may change, multiple row control lines 41 to 43 connecting the sensor elements in the row direction and applying a predetermined charging voltage for detecting the capacitance of the sensor elements to the sensor elements, multiple column control lines 44 to 46 for connecting the sensor elements in the column direction and connecting the sensor elements to the ground potential side, the microcontroller 20 (an example of a control circuit) supplying a charging voltage via a row control line to the sensor element subject to measurement, measuring a voltage change of the sensor element, and detecting the capacitance of the sensor element based on the voltage change, and the equipotential circuit 18 outputting a signal having a potential equal to the potential of the sensor element subject to measurement. The microcontroller applies a charging voltage to the row control line connected to the sensor element subject to measurement and connects the column control line connected to the sensor element to the ground potential side. At the same time, the microcontroller 20 uses the equipotential circuit 18 to set a potential of at least one of a row control line other than the row control line connected to the sensor element subject to measurement and a column control line other than the column control line connected to the sensor element subject to measurement to a potential equal to the potential of the sensor element subject to measurement.

According to the configuration, the equipotential circuit 18 sets the row control lines and the column control lines other than the row control line and the column control line connected to the sensor element subject to measurement to the same potential as the potential of the sensor element subject to measurement. As a result, the influence of the capacitance of the sensor element other than the measurement object is reduced, and the measurement accuracy of the capacitance can be improved.

Second Embodiment

In the configuration of the first embodiment, the capacitance (C) in the RC circuit is measured by measuring the potential of the capacitive sensor element; however, depending on an AD converter etc. built in the microcontroller 20, electric charges accumulated in the sensor elements C1 to C9 is extracted and measured at the time of measurement of the potentials of the sensor elements. If the electric charges are extracted, the potentials of the sensor elements C1 to C9 decrease, which causes a problem that correct measurement cannot be performed.

Therefore, in this embodiment, instead of directly measuring the potentials of the sensor elements C1 to C9, a potential generated via an equipotential circuit is measured.

Figure 8:
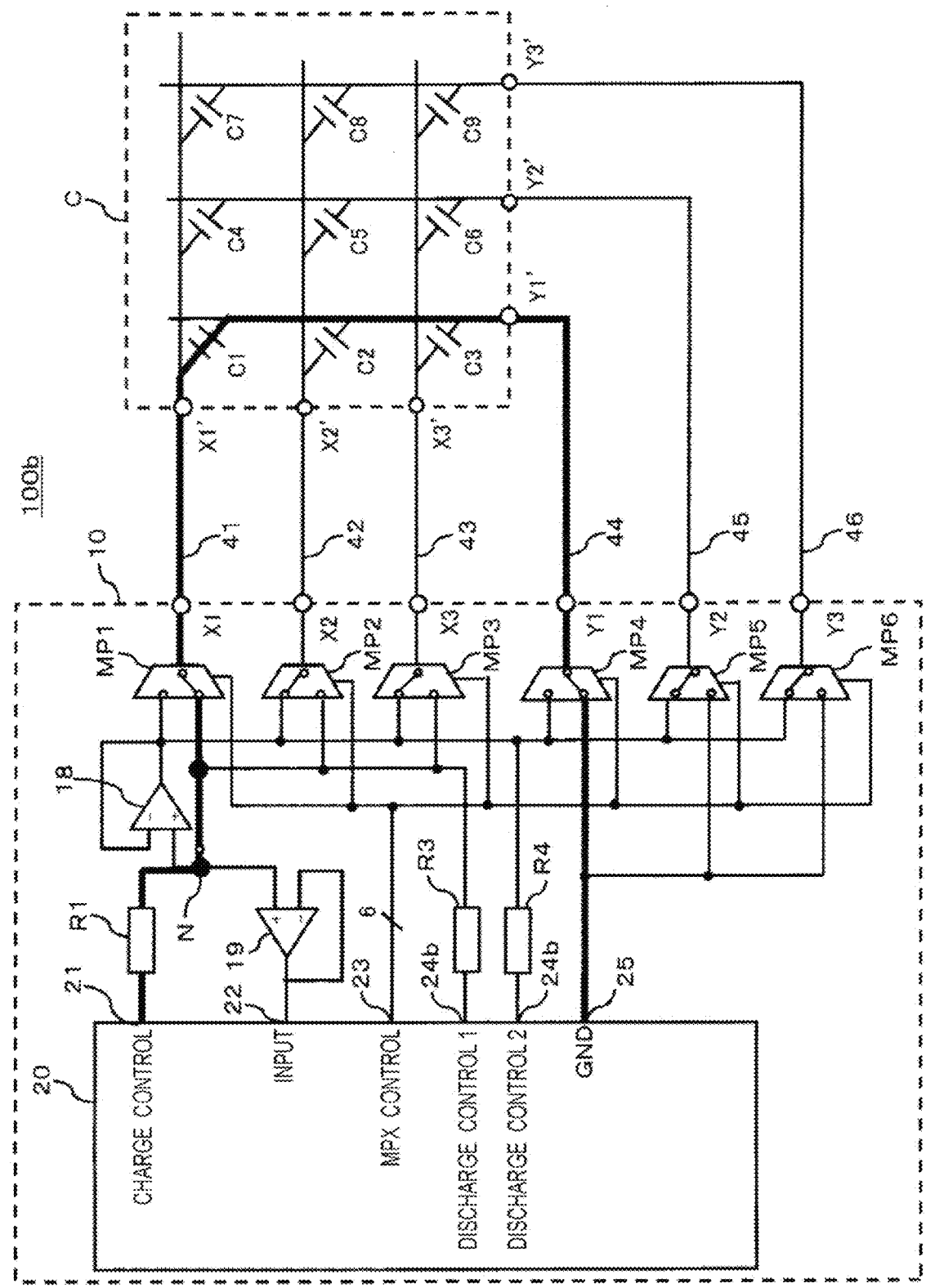
FIG. 8 is a diagram showing a configuration of a capacitance detection device according to a second embodiment of the present disclosure.

FIG. 8 is a diagram showing a configuration of the capacitance detection device 100b according to a second embodiment of the present disclosure. As shown in FIG. 8, the capacitance detection device 100b of this embodiment further includes a second equipotential circuit 19 between the node N and the input terminal 22 in addition to the configuration of the first embodiment.

The second equipotential circuit 19 has the same configuration as the equipotential circuit 18 (first equipotential circuit) and outputs a potential equal to the potential input to the positive input terminal. The second equipotential circuit 19 has a positive input terminal connected to the node N and an output connected to the input terminal 22. With this configuration, the sensing voltage is input via the second equipotential circuit 19 to the input terminal 22 of the microcontroller 20. In this case, even if the electric charge is extracted by an AD converter etc., the electric charge is replenished from the second equipotential circuit 19, so that the potentials of the sensor elements C1 to C9 can be prevented from decreasing. As a result, the measurement accuracy can be improved.

Third Embodiment

Depending on a capacitance value desired to be measured in the sensor elements C1 to C9, a voltage required for charging the sensor elements changes, and a measurement accuracy and a measurement time change. If the capacitance values of the sensor elements C1 to C9 are large, the charging/measurement time is elongated so as to provide sufficient accuracy.

Therefore, in this embodiment, the microcontroller 20 is provided with multiple charge control terminals to which resistors having different resistance values are connected, and the charge control terminals, i.e., the resistance values, can be switched depending on a capacitance value desired to be measured.

Figure 9:
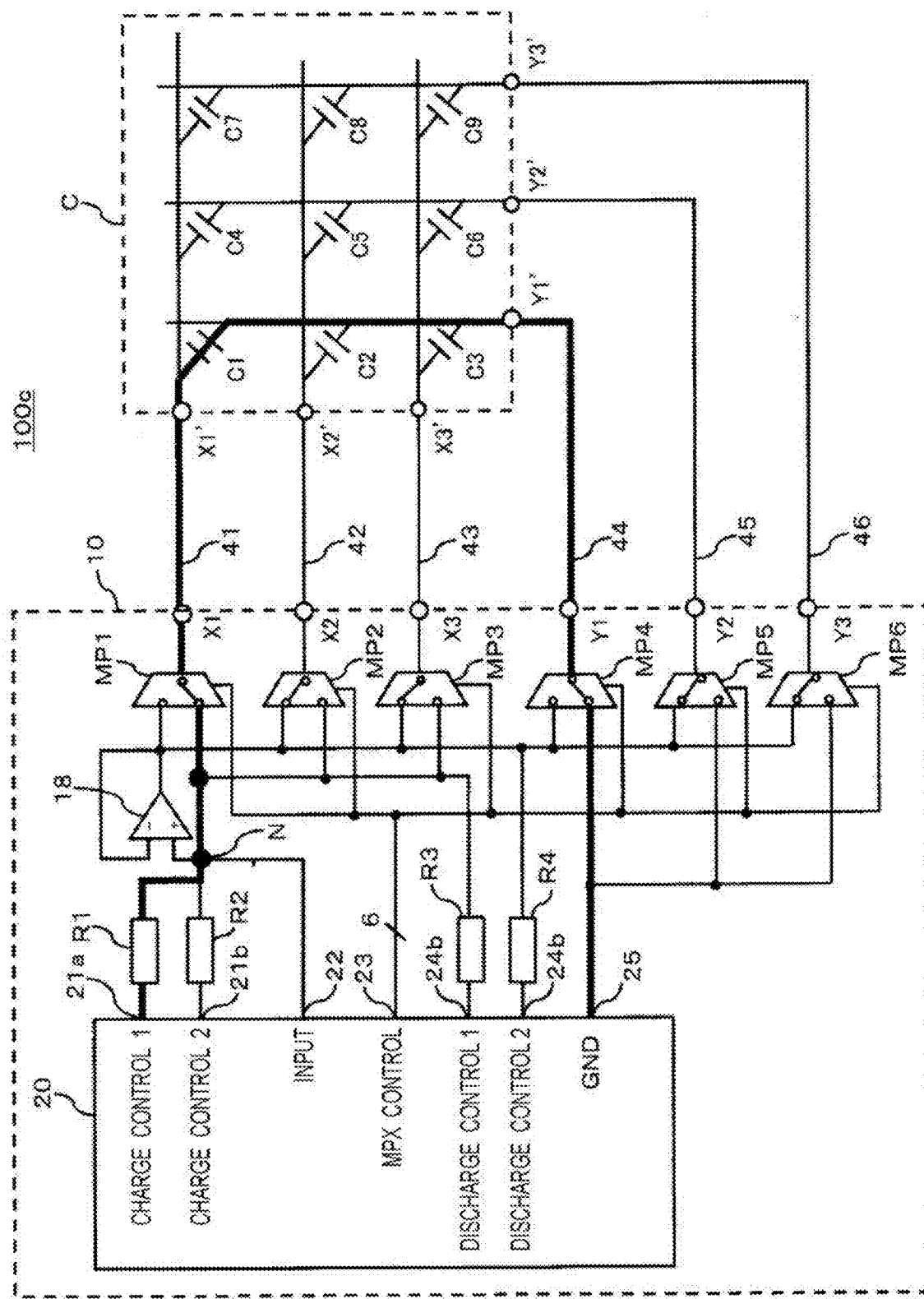
FIG. 9 is a diagram showing a configuration of a capacitance detection device according to a third embodiment of the present disclosure.

FIG. 9 is a diagram showing a configuration of a capacitance detection device according to a third embodiment of the present disclosure. As shown in FIG. 9, in a capacitance detection device 100c of this embodiment, the microcontroller 20 includes two charge control terminals 21, 21b. A resistor R1 is connected to the charge control terminal 21a, and a resistor R2 having a resistance value different from the resistor R1 is connected to the charge control terminal 21b.

For example, in the time measurement method, a sensor element is charged through a resistor to check the potential thereof, and in this case, the measurement accuracy can further be improved by changing a resistance value depending on a magnitude of the capacitance value. For example, the resistance value may be switched as follows.

When the capacitance is small: the resistance value is made larger. As a result, although the measurement time becomes longer, the time resolution can be increased.

When the capacitance is large: the resistance value is made smaller. As a result, the measurement time can be shortened.

As described above, by preparing multiple charge control terminals to which different resistors are connected, an optimum resistance value can be selected for measurement depending on a situation.

Alternatively, after the measurement is first performed at a high speed with a low resistance value, a sensor element having a change from the previous measurement can accurately be measured with a high resistance value.

Fourth Embodiment

Figure 10:
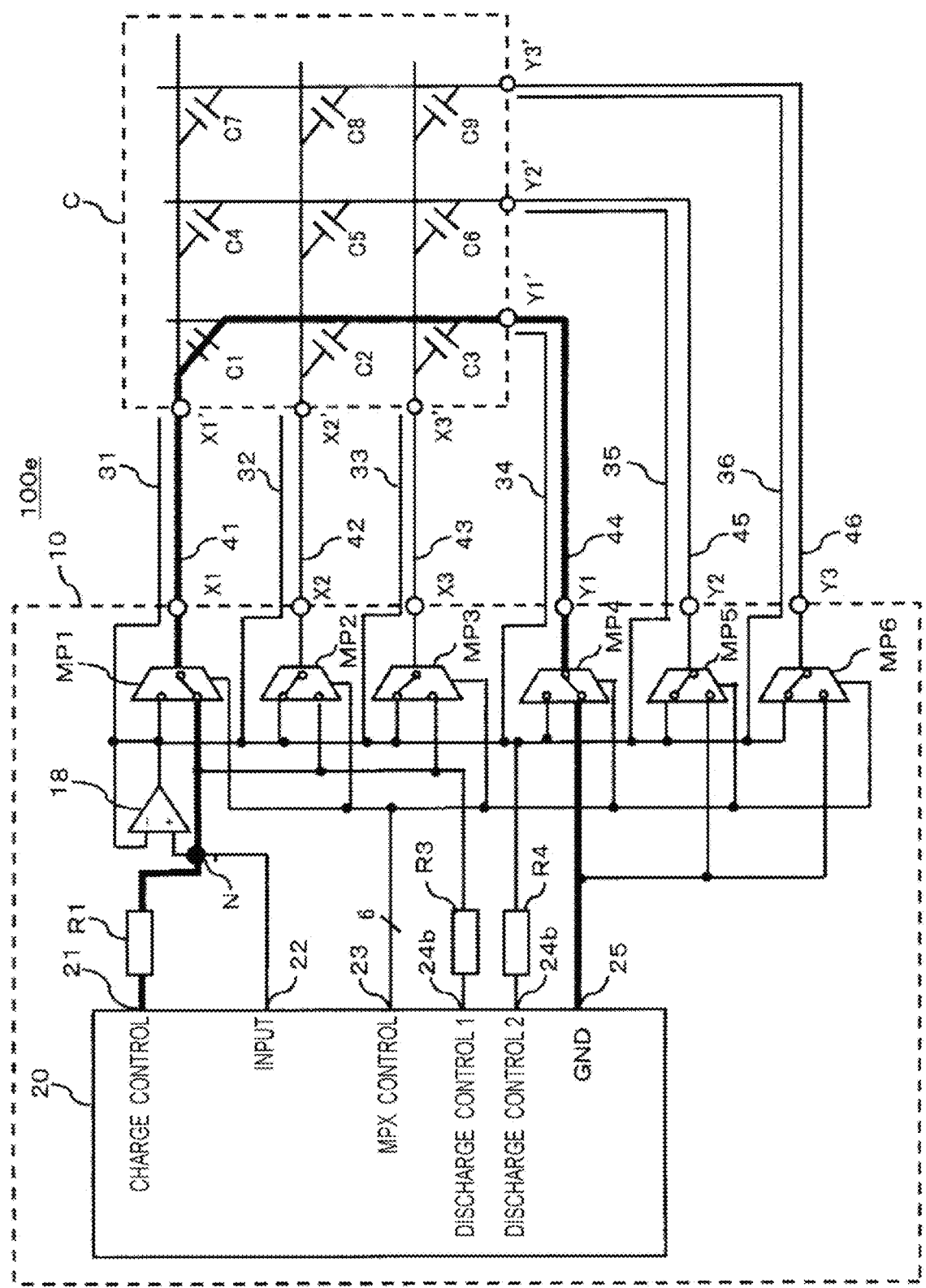
FIG. 10 is a diagram showing a configuration of a capacitance detection device according to a fourth embodiment of the present disclosure.

FIG. 10 is a diagram showing a configuration of a capacitance detection device according to a fourth embodiment of the present disclosure. A capacitance detection device 100e of this embodiment is further provided with shield lines 31 to 36 electrically shielding the row control lines 41 to 43 and the column control lines 44 to 46 between the sensor unit C and the measurement unit 10.

Each of the shielded wires 31 to 36 is formed by arranging multiple covered conductive wires around the control line 40a located at the center, for example. The configuration of the shield lines 31 to 36, i.e., a shield means for the control lines 41 to 46 is not limited thereto.

By shielding the control lines 41 to 46 in this way, the influence of external noise on the control lines 41 to 46 can be reduced, and fluctuations caused by noise can be reduced in the voltage of the sensor elements of the sensor unit C measured by the measurement unit 10.

However, when the shield lines 31 to 36 are disposed, a parasitic capacitance is generated between the control lines 41 to 46 and the shield lines 31 to 36. Due to this parasitic capacitance, a value significantly different from the capacitance value of the sensor element originally desired to be measured may be measured, and the measurement accuracy may be reduced.

Therefore, in this embodiment, as shown in FIG. 10, the shield lines 31 to 36 are connected to the output of the equipotential circuit 18. The equipotential circuit 18 sets the potentials of the shield lines 31 to 36 to the same potentials as those of the sensor elements C1 to C9 subject to measurement while measuring the capacitances of the sensor elements C1 to C9. This reduces the influence of the parasitic capacitance between the control lines 41 to 46 and the shield lines 31 to 36.

As described above, according to the capacitance detection device 100e of this embodiment, the influence of external noise on the control lines 41 to 46 can be reduced, and the capacitance can accurately be measured.

Fifth Embodiment

In the embodiment described above, during the measurement of the capacitance, both the row control lines 41 to 43 and the column control lines 44 to 46 connected to the sensor elements other than that subject to measurement are controlled to a potential equal to the potential of the sensor element subject to measurement by the equipotential circuit 18. However, during measurement of the capacitance, only one of the row control lines 41 to 43 and the column control lines 44 to 46 connected to the sensor element other than that subject to measurement may be controlled to a potential equal to the potential of the sensor element subject to measurement by the equipotential circuit 18. In this embodiment, description will be made of a configuration in which only the column control lines 44 to 46 are controlled by the equipotential circuit 18 to a potential equal to the potential of the sensor element subject to measurement.

Figure 11:
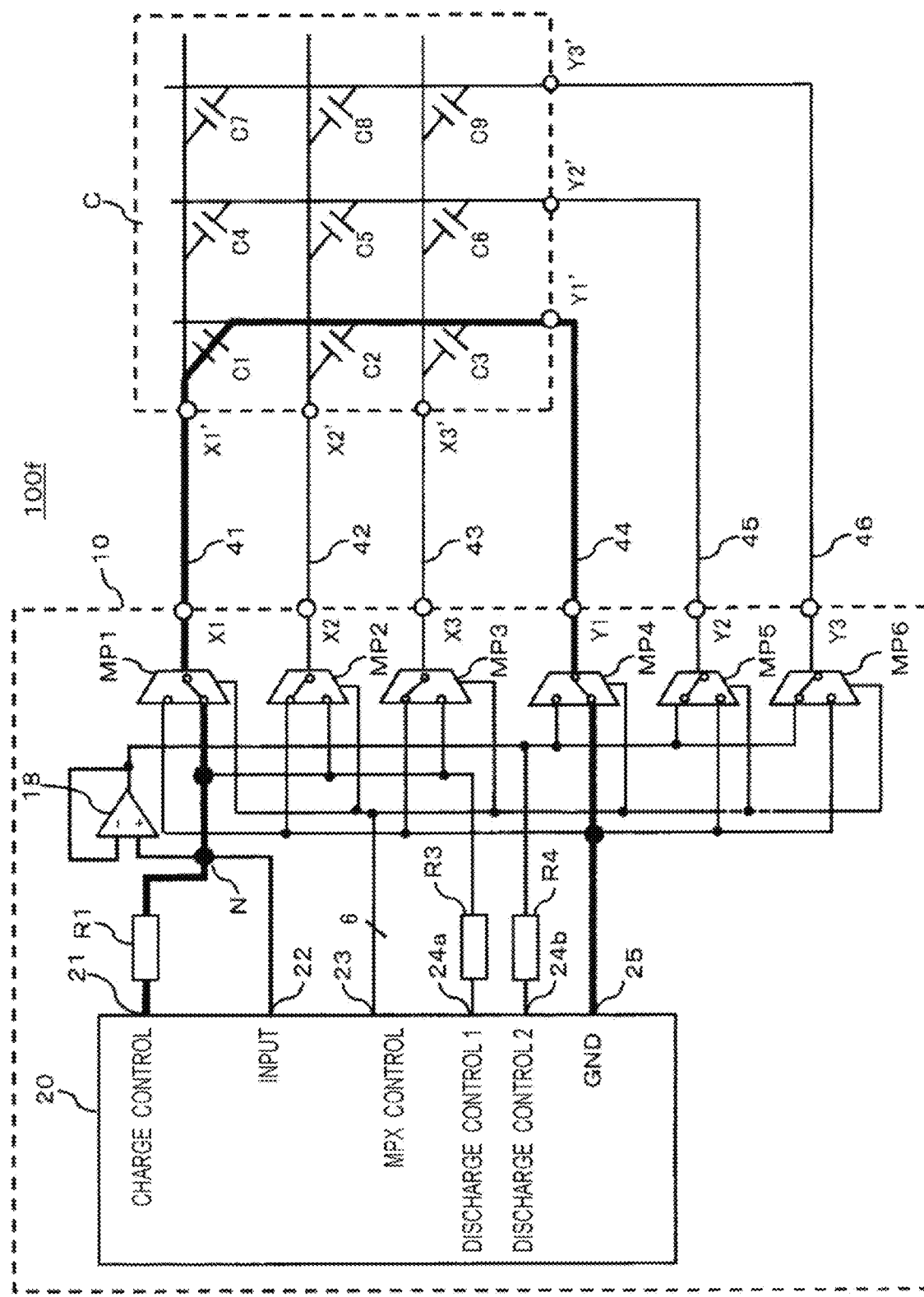
FIG. 11 is a diagram showing a configuration of a capacitance detection device according to a fifth embodiment of the present disclosure.

FIG. 11 is a diagram showing a configuration of a capacitance detection device according to a fifth embodiment of the present disclosure. In a capacitance detection device 100f of this embodiment, the multiplexers MP1 to MP3 connected to the row control lines 41 to 43 have one input connected to the charge control terminal 22 via the resistor R1 and the other input connected to the ground terminal 25. The multiplexers MP4 to MP6 connected to the column control lines 44 to 46 have one input connected to the output of the equipotential circuit 18, and the other input connected to the ground terminal 25.

In the configuration described above, when the capacitance of the sensor element is measured, the row control lines 41 to 43 connected to the sensor element subject to measurement are connected to the charge control terminal 21, and the row control lines 41 to 43 connected to the sensor elements other than the that subject to measurement is connected to the ground terminal 25. The column control lines 44 to 46 connected to the sensor element subject to measurement are connected to the ground terminal 25, and the row control lines 41 to 43 connected to the sensor element other than that subject to measurement are connected to the equipotential circuit 18.

The equipotential circuit 18 outputs the potential of the node N, i.e., the sensor element subject to measurement. Therefore, the potentials of the control lines 44 to 46 other than the column control lines connected to the sensor element subject to measurement are equal to the potential of the sensor element subject to measurement. Therefore, the electric charge accumulated in the capacitances of the sensor elements other than the sensor element subject to measurement is reduced, and the measurement accuracy can be improved.

Sixth Embodiment

Figure 12:
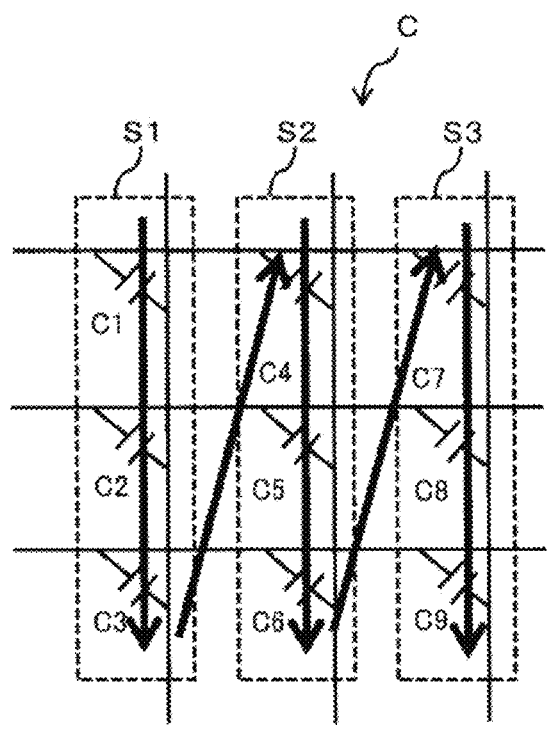
FIG. 12 is a diagram for demonstrating the order of the potential measurement of the sensor elements in the capacitance detection device according to the fifth embodiment.

In the configuration of the capacitance detecting device according to the embodiment described above, the sensor elements C1 to C9 perform discharge from the discharge control terminals 24a, 24b; however, charging electric charge become too large and a charging/discharging failure may occur at the time of discharge. This causes a problem that if an electric charge sneaks from the discharge failure sensor element to another sensor element, the measurement accuracy deteriorates. Therefore, to solve this problem, the control lines 41 to 46 at the time of measurement of the capacitance may be switched in the order shown in FIG. 12. Specifically, the position of the sensor subject to measurement is sequentially switched in the column direction and is switched in the row direction when no switching can be made in the column direction. As described above, by changing the row control line in preference to the column control line, the electric charge is more likely to escape (i.e., the ground potential level is easily returned), and the discharge failure is improved.

Seventh Embodiment

Figure 13:
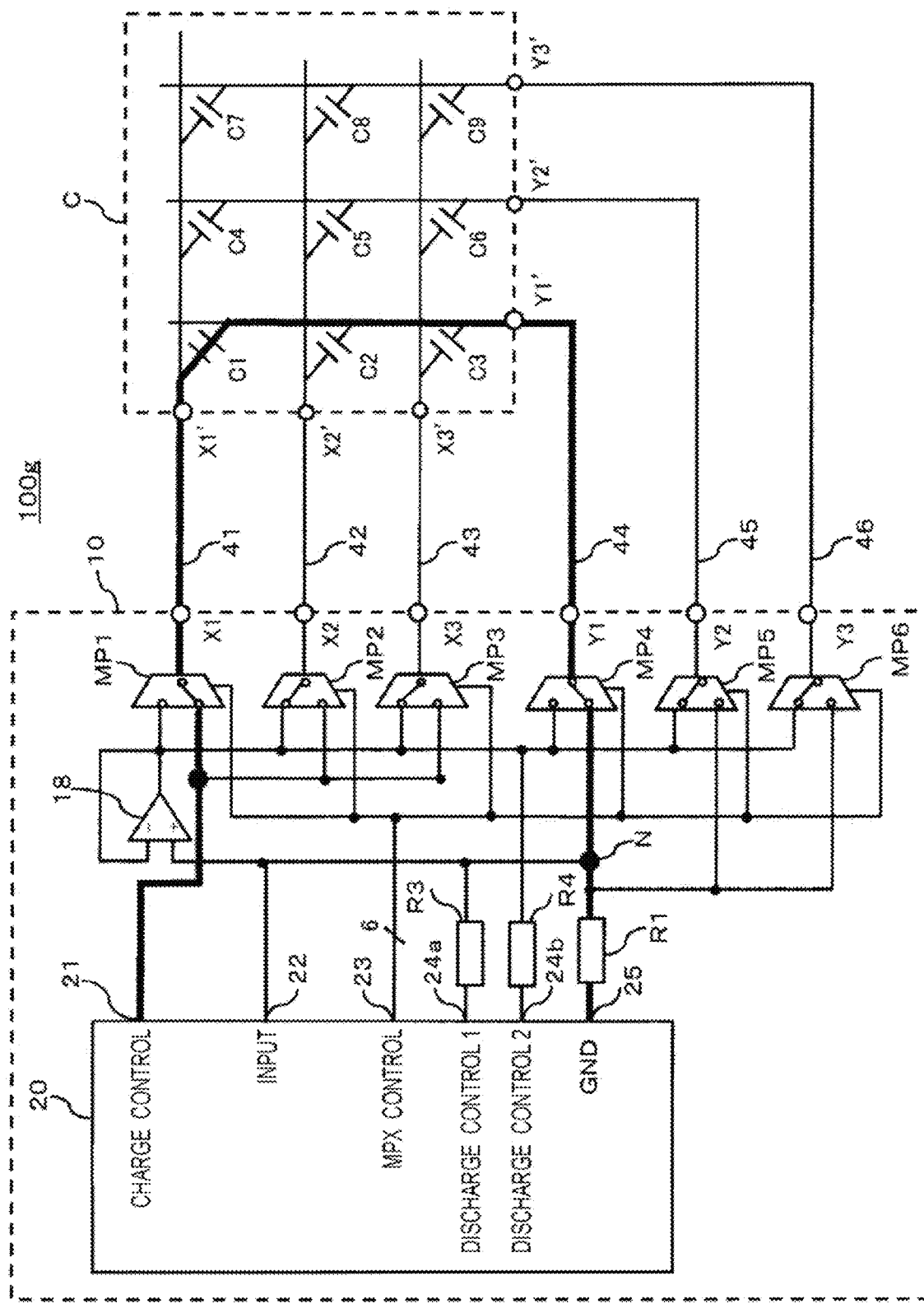
FIG. 13 is a diagram showing a configuration of a capacitance detection device according to a sixth embodiment of the present disclosure.

FIG. 13 is a diagram showing a configuration of a capacitance detection device 100g according to a seventh embodiment. In the embodiments described above, the resistor R1 is connected to the charge control terminal 21 side; however, the resistor R1 may not necessarily be on the charge control terminal 21 side. As shown in FIG. 13, the resistor R1 may be connected to the ground terminal (GND) 25 side. A node N is provided between the resistor R1 and the multiplexers MP4 to MP6 and is connected to the input terminal 22 to measure the voltages of the sensor elements C1 to C9. The node N is connected to the positive input terminal (+) of the equipotential circuit 18 to generate a potential equal to the node N. By using this circuit and providing the same control as in the embodiments described above, the capacitance C can be obtained in accordance with Eq. (1).

Other Embodiments

As described above, the first to seventh embodiments have been described as exemplification of the techniques disclosed in the present application. However, the techniques in the present disclosure are not limited thereto and are also applicable to embodiments with modifications, replacements, additions, omissions, etc. made as appropriate. Additionally, the constituent elements described in the first to seventh embodiments can be combined to provide a new embodiment.

In the examples described in the embodiments, the microcontrollers 20 calculate the capacitance of the sensor element based on the sensing voltage Vc of the sensor element; however, a device (or circuit) other than the microcontrollers 20 may calculate the capacitance based on the sensing voltage Vc.

Although the microcontrollers 20 is exemplified as the control circuit, the control circuit is not limited to the microcontroller and may be implemented by other types of devices. The function of the control circuit may be implemented through cooperation between hardware and software or may be implemented only by specially designed hardware. Therefore, the control circuit can be implemented by various processors such as a microcontroller, CPU, MPU, GPU, FPGA, DSP, and ASIC.

The embodiments have been described as exemplification of the techniques in the present disclosure. The accompanying drawings and the detailed description have been provided for this purpose.

Therefore, the constituent elements described in the accompanying drawings and the detailed description may include not only the constituent elements essential for solving the problem but also constituent elements not essential for solving the problem so as to illustrate the techniques. Thus, even though these non-essential constituent elements are included in the accompanying drawings and the detailed description, these non-essential constituent elements should not immediately be recognized as being essential.

Since the embodiments described above are intended to illustrate the techniques in the present disclosure, various modifications, replacements, additions, omissions, etc. can be made within the claims and the scope equivalent thereto.

INDUSTRIAL APPLICABILITY

The present disclosure is applicable to a capacitance detection device including a capacitive sensor.

The invention claimed is:
1. A capacitance detection device comprising:
a sensor unit including a plurality of sensor elements which are arranged two-dimensionally and whose capacitances change;

a plurality of row control lines connecting the sensor elements in a row direction and applying to the sensor elements a predetermined charging voltage for detecting the capacitance of the sensor elements;

a plurality of column control lines connecting the sensor elements in a column direction and connecting the sensor elements to the ground potential side;

a control circuit supplying a charging voltage to the sensor element subject to measurement via the row control lines, measuring a voltage change of the sensor element, and detecting the capacitance of the sensor element based on the voltage change;

an equipotential circuit outputting a signal having a potential equal to a potential of the sensor element subject to measurement; and a second equipotential circuit including an input terminal and an output terminal, generating a signal having the same potential as a signal input from the input terminal and outputting the signal from the output terminal without drawing a current from the input terminal, wherein the control circuit applies a charging voltage to the row control line connected to the sensor element subject to measurement, connects the column control line connected to the sensor element to the ground potential side, and causes the equipotential circuit to set a potential of at least one of the row control line other than the row control line connected to the sensor element subject to measurement and the column control lines other than the column control line connected to the sensor element subject to measurement, to a potential equal to the potential of the sensor element subject to measurement, and, wherein the control circuit includes a voltage input terminal for inputting a voltage of the sensor element, and the control circuit inputs the voltage of the sensor element subject to measurement to the voltage input terminal via the second equipotential circuit.

2. The capacitance detection device according to claim 1, wherein the control circuit measures, as the voltage change of the sensor element, a voltage of the sensor element when the charging voltage is supplied to the sensor element for a predetermined time, and/or a time from a start of charging of the sensor element until the voltage of the sensor element reaches a predetermined voltage.

3. The capacitance detection device according to claim 1, wherein the control circuit includes a plurality of charge control terminals that are terminals supplying a charging voltage to the row control lines and connected to resistors having resistance values different from each other.

4. The capacitance detection device according to claim 1, further comprising a shield line connected to an output of the equipotential circuit and electrically shielding the row control line and the column control line.

5. The capacitance detection device according to claim 1, wherein the equipotential circuit is connected to the column control line, and the control circuit sequentially changes the position of the sensor element subject to measurement in a column direction, and when no switching can be made in the column direction, changes the position in a row direction.

\* \* \* \* \*